(12) United States Patent
Rinaldi et al.

(10) Patent No.: US 9,787,340 B2
(45) Date of Patent: Oct. 10, 2017

(54) ZERO POWER RADIO FREQUENCY RECEIVER

(71) Applicants: Northeastern University, Boston, MA (US); The Charles Stark Draper Laboratory, Inc., Cambridge, MA (US)

(72) Inventors: Matteo Rinaldi, Boston, MA (US); Nicol McGruer, Dover, MA (US); Amy Duwel, Cambridge, MA (US); Marc S. Weinberg, Needham, MA (US); Robert Egri, Carlisle, MA (US); Cristian Cassella, East Boston, MA (US)

(73) Assignees: Northeastern University, Boston, MA (US); The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/290,972

(22) Filed: Oct. 11, 2016

(65) Prior Publication Data

US 2017/0126263 A1    May 4, 2017

Related U.S. Application Data

(60) Provisional application No. 62/239,100, filed on Oct. 8, 2015, provisional application No. 62/240,934, filed on Oct. 13, 2015.

(51) Int. Cl.
*H04B 1/18* (2006.01)
*H01H 59/00* (2006.01)
(Continued)

(52) U.S. Cl.
CPC ............ *H04B 1/18* (2013.01); *H01H 59/0009* (2013.01); *H01L 41/0477* (2013.01); *H01L 41/107* (2013.01)

(58) Field of Classification Search
CPC .. H04B 1/18; H01H 59/0009; H01L 41/0477; H01L 41/107; H01L 41/04; H01L 41/047;
(Continued)

(56) References Cited

U.S. PATENT DOCUMENTS 5,923,542 A * 7/1999 Sasaki ................... H01L 41/044
                                                                  310/318
6,153,962 A * 11/2000 Noma ................ H05B 41/2822
                                                                  310/316.01

(Continued)

OTHER PUBLICATIONS

Bernstein. "3D Low Frequency Wakeup Receiver," https://web.archive.org/web/20150405020317/http://ams.com/eng/Products/RF-Transmitters-Receivers/LF-Receivers/AS3933, accessed Apr. 5, 2015.

(Continued)

*Primary Examiner* — Pablo Tran
(74) *Attorney, Agent, or Firm* — Posternak Blankstein & Lund LLP (57) ABSTRACT

A zero power radio frequency (RF) activated wake up device is provided. The device is based on a high-Q MEMS demodulator that filters an amplitude-modulated RF tone of interest from the entire spectrum while producing a much higher voltage signal suitable to trigger a high-Q MEMS resonant switch tuned to the modulation frequency of the RF tone.

21 Claims, 6 Drawing Sheets

(51) Int. Cl.
*H01L 41/04* (2006.01)
*H01L 41/107* (2006.01)
*H01L 41/047* (2006.01)

(58) Field of Classification Search
CPC .............. H01L 41/044; H05B 41/2822; H05B 41/2827; H02M 3/24; H02M 3/335; H02M 3/33507; H02N 2/00; H02N 2/004; H03H 3/0072
See application file for complete search history.

(56) References Cited

U.S. PATENT DOCUMENTS

| | | | | |
|---|---|---|---|---|
| 6,504,734 | B2 * | 1/2003 | Navas Sabater | H02M 3/28 363/16 |
| 7,969,754 | B2 * | 6/2011 | Radecker | H02M 3/33507 323/244 |
| 8,193,877 | B2 * | 6/2012 | Fritz | H03H 9/706 333/133 |
| 8,860,322 | B2 * | 10/2014 | Wei | H05B 37/02 315/200 R |
| 9,093,947 | B2 * | 7/2015 | Wei | H02P 31/00 |
| 9,257,917 | B1 * | 2/2016 | Filardo | H02N 2/181 |
| 9,419,583 | B2 | 8/2016 | Rinaldi et al. | |
| 9,425,765 | B2 | 8/2016 | Rinaldi et al. | |
| 2005/0281061 | A1 * | 12/2005 | Radecker | H02M 3/28 363/21.02 |
| 2009/0039798 | A1 * | 2/2009 | Siessegger | H05B 41/2881 315/276 |
| 2017/0102263 | A1 | 4/2017 | Bernstein et al. | |

OTHER PUBLICATIONS

Tomimatsu et al. "A wake-up switch using a piezoelectric differential pressure sensor," IEEE Intelligent Sensors, Sensor Networks and Information Processing Conference, Melbourne VIC, Apr. 2-5, 2013, pp. 23-26.
Gu et al. "Radio-Triggered Wake-Up Capability for Sensor Networks," Proceedings of the 10th IEEE Real-Time and Embedded Technology and Applications Symposium (RTAS'04), 2004.
Brocato. A Zero-Power Radio Receiver. Sandia Report SAND 2004-4610, Sep. 2004.
Parks et al. "A Wireless Sensing Platform Utilizing Ambient RF Energy," Biomedical Wireless Technologies, Networks, and Sensing Systems, Austin, TX, Jan. 20-23, 2013, pp. 160-162.
Parks et al. "Sifting Through the Airwaves: Efficient and Scalable Multiband RF Harvesting," 2014 IEEE International conference on RFID (IEEE RFID), Orlando, FL, Apr. 8-10, 2014, pp. 74-81.
Olsson. "Zero Power Acoustic Signal Processing", Science Matters Sandia National Laboratories, Mar. 2010, www.sandia.gov/mstc/_assets/documents/science/Science%20Matters%20Spring%202010%-20Zero%20Power%20Accoustic%20Signal%20Processingl.pdf.
Sifuentes, et al. "Wireless Magnetic Sensor Node for Vehicle Detection With Optical Wake-Up" IEEE Sensors Journal, vol. 11, No. 8, Aug. 2011, pp. 1669-1676.
Lin et al. "The Micromechanical Resonant Switch ('Resoswitch')," Technical Digest Solid State Sensor, Actuator, and Microsystems Workshop, Hilton Head, SC, Jun. 1-5, 2004, pp. 40-43.
Lin et al. "A Resonance Dynamical Approach to Faster, More Reliable Micromechanical Switches," IEEE Frequency Control Symposium, May 19-21, 2008. pp. 640-655.
Rinaldi et al. "Reconfigurable CMOS Oscillator based on Multifrequency AlN Contour-Mode MEMS Resonators", IEEE Transactions on Electron Devices, vol. 58, issue 5, p. 1281-1286, 2011.
Rinaldi et al. "Super High Frequency Two-Port AlN Contour-Mode Resonators for RF Applications", IEEE Transactions on Ultrasonics, Ferroelectrics, and Frequency Control, vol. 57, n. 1, p. 38-45, 2010.
Chen et al. "Aluminum Nitride cross-sectional Lamé mode resonators with 260 MHz lithographic tuning capability and high kt2 > 4%", Frequency Control Symposium (IFCS), 2016 IEEE International, May 9-12, 2016.

\* cited by examiner

Fig. 6B

ZERO POWER RADIO FREQUENCY RECEIVER

CROSS REFERENCE TO RELATED APPLICATIONS

This application claims the priority of U.S. Provisional Application No. 62/239,100 filed 8 Oct. 2015 and entitled "Zero Power Radio Frequency Receiver", and claims the priority of U.S. Provisional Application No. 62/240,934 filed Oct. 13, 2015 and entitled "Piezoelectric Cross-Section Lamé Mode Transformer". The whole of both applications is hereby incorporated by reference.

STATEMENT REGARDING FEDERALLY SPONSORED RESEARCH OR DEVELOPMENT

The invention was developed with financial support from Grant No. DARPA N-ZERO-HR0011-15-C-0138 from the Defense Advanced Research Projects Agency. The U.S. Government has certain rights in the invention.

BACKGROUND

Low-power wireless sensing nodes are key-components in the internet-of-things. Generally, these are formed by a group of passive sensors whose captured information is only transmitted when requested by other interrogating nodes in the network. One of the main sources of energy loss in conventional wireless sensing nodes is the power dissipated by their always active radios. The use of wake-up receivers has been proposed as a way to significantly reduce power dissipation, thus increasing the duration of their batteries.

Wake-up receivers are triggered by the presence of an RF (radio frequency) signal received by the antenna from the interrogating node. When the correct signal is received, the radio is turned on and the information captured by one or more sensors associated to the node is transmitted. The most important component of a wake-up receiver is the RF sensor that produces the triggering signal that turns on the radio when needed. Traditional RF sensors rely on diode-based rectifiers. These devices generate, from a portion of the received RF-power, a DC voltage controlling the operational status of the radio. However, because of their limited conversion efficiency and significant threshold voltages, these sensors require a significant input power to generate the DC voltage, thus demanding greater power.

Radio wakeup circuits have been designed in both passive (zero-power) and active low power mechanizations. Active low power approaches are commercially available [1] and continue to be optimized for sensitivity versus power consumption [2]. However, these traditional architectures cannot approach nW levels required for certain applications, such as the internet of things. A completely passive approach was proposed and analyzed by Gu and Stankovic [3] and in parallel by Brocato [4], who described it as a modern version of the AM crystal radio. The experimental work in [4] concluded that high Q resonators and significantly improved detectors are needed in order to achieve high sensitivity. More recent work by Parks et al. [5,6] develops wake-up circuits towards energy harvesting applications, but sensitivity is limited to the 10-20 µW level.

A switch has been developed [7] that employs a piezo-electric bimorph excited by vibration. The transducer is fed into the gate of an N-MOSFET. While the power with zero input is less than 10 nW, much more power is consumed for less than threshold inputs. Similarly, pressure and flow [8] activated piezoelectric switches were activated with FET power consumption stated at 1.5 µW. A light dependent resistor (LDR) has been proposed to wake up a magnetic sensor to determine the presence of automobiles [9]. However, continuous power consumption in the LDR was much greater than nW levels. Resonant switches for MHz applications with fast switching times have been developed [10-12].

There remains a need for radio wakeup circuits and receiver devices that operate at low power in the nW range.

SUMMARY OF THE INVENTION

The invention provides a fully passive microelectromechanical (MEM) RF receiver. The receiver operates at extremely low threshold power, provides excellent signal discrimination, and has a very small form-factor. The receiver contains an aluminum nitride (AlN) piezoelectric cross-sectional Lamé mode transformer cascaded to an electrostatic MEM resonant switch and a MEM threshold switch. The transformer is a two-port AlN device exploiting the high electromechanical coupling coefficient ($k_t^2$) attained by cross-sectional Lamé mode resonator technology to achieve high voltage amplification from the output of the antenna to the input of the resonant switch. The resonant switch is a low input capacitance, high sensitivity, high-Q poly-SiGe resonant switch with a small actuator gap (e.g., 100 nm). The switch has a small separation (e.g., 50 nm) between its tip and a thin metal layer connected to a DC voltage supply. The threshold switch is a conventional MEMS switch which can be fabricated in the same SiGe technology, optimized with low-adhesion contacts for low-voltage operation.

The receiver is driven by an ad-hoc optimized amplitude modulated (AM) signal, so that all its voltage-amplified output spectral components are within a 3 dB bandwidth. The quadratic electrostatic force driving the resonant switch produces resonant motion at the modulation frequency. During its vibration, the resonant switch periodically connects the DC voltage source to a load capacitance ($C_{load}$) whose stored charge increases proportionally to the number of contact cycles. As the voltage across $C_{load}$ becomes large enough to activate the threshold switch, the radio turns on and the sensor starts transmitting the information to the interrogating node. The transformer device permits activation of the threshold switch, and consequently, of the radio, through a low input power of −55 dBm or less.

One aspect of the invention is a zero power radio frequency receiver. The receiver includes: a radio frequency antenna, a microelectromechanical voltage transformer, a resonant detector switch, and a power source that drives a wakeup circuit. The transformer has an input and an output. The input is connected to the antenna. The transformer amplifies an amplitude modulated radio frequency (RF) input signal received by the antenna and provides a modulation frequency of the input signal at the transformer output. The resonant detector switch is connected to the output of the transformer and is tuned to the modulation frequency of the transformer. The switch includes a low adhesion contact that closes in response to the modulation frequency; closing of the low adhesion contact completes the wakeup circuit and activates the electronic device of which the circuit is a part.

In an embodiment of the receiver described above, the receiver further includes a threshold switch. The threshold switch includes a threshold contact residing in the wakeup circuit. The threshold switch is connected to the resonant detector switch, and the threshold contact closes in response to closing of the low adhesion contact of the resonant detector switch.

Another aspect of the invention is a device that contains a plurality of zero power radio frequency receivers as described above. The receivers are tuned to two or more different input signals, each different input signal having a different RF frequency. The resonant detector switches of the receivers are connected in series and activate a single threshold switch. As a result of this configuration, the threshold switch is activated and a wakeup signal is generated only when each of the plurality of different RF input signals is detected.

Yet another aspect of the invention is an electronic device containing the zero power radio frequency receiver or the device described above. The electronic device can be, for example, a sensing node in a wireless network.

The invention can be further summarized by the following list of embodiments.

1. A zero power radio frequency receiver comprising:
    a radio frequency antenna;
    a microelectromechanical voltage transformer having an input and an output, wherein the input is connected to the antenna, wherein the transformer amplifies an amplitude modulated radio frequency (RF) input signal received by the antenna, and wherein the transformer provides a modulation frequency of the input signal at the transformer output;
    a resonant detector switch connected to the output of the transformer and tuned to the modulation frequency, the switch comprising a low adhesion contact that closes in response to the modulation frequency; and
    a power source that drives a wakeup circuit, wherein the wakeup circuit is closed by closing of the low adhesion contact.
2. The receiver of embodiment 1, further comprising a threshold switch comprising a threshold contact residing in the wakeup circuit, the threshold switch connected to the resonant detector switch, wherein the threshold contact closes the wakeup circuit in response to closing of said low adhesion contact.
3. The receiver of embodiment 1 or embodiment 2, wherein the closed wakeup circuit produces a wakeup signal for an electronic device.
4. The receiver of embodiment 3, further comprising an input capacitance that loads the output of the transformer and an output capacitance that loads the wakeup circuit, wherein the input capacitance stores charge used to activate the threshold switch, and wherein the output capacitance stores charge used to produce the wakeup signal.
5. The receiver of embodiment 1, wherein the power source is a battery.
6. The receiver of embodiment 1, wherein the transformer is a piezoelectric mechanical voltage transformer.
7. The receiver of embodiment 6, wherein the transformer comprises a film of AlN in contact with two interdigitated electrodes.
8. The receiver of embodiment 1, wherein the transformer has a gain of at least 30.
9. The receiver of embodiment 1, wherein the transformer is able to detect and amplify incoming radio frequency signals having a power of −60 dBm or lower.
10. The receiver of embodiment 1, wherein the transformer is tuned to an input signal in the MHz range and the resonant detector switch is tuned to a modulation signal in the 50-100 kHz range.
11. The receiver of embodiment 1, wherein the resonant detector switch comprises:
    a substrate;
    a cantilever supported by the substrate, the cantilever having a resonant electrode structure and comprising a first aluminum nitride layer, a first electrode layer disposed on the first aluminum nitride layer, a second aluminum nitride layer disposed on the first electrode layer, and a second electrode layer disposed on the second aluminum nitride layer; and
    a low adhesion contact disposed at a free end of the cantilever;
    wherein vibration of the resonant electrode structure closes the low adhesion contact in response to a selected input signal frequency.
12. The receiver of embodiment 11, wherein low adhesion contact comprises a material selected from the group consisting of platinum, tungsten, ruthenium, and ruthenium oxide.
13. The receiver of embodiment 1 that has a Q-factor of at least 1000.
14. The receiver of embodiment 1 that uses about 10 nW or less of power in the absence of the input signal.
15. A device comprising a plurality of zero power radio frequency receivers of embodiment 1 or embodiment 2, wherein the receivers are tuned to two or more different input signals, each different input signal having a different RF frequency, wherein the resonant detector switches of the receivers are connected in series and activate a single threshold switch.
16. The device of embodiment 15, wherein the threshold switch is activated and a wakeup signal generated only when each of the plurality of different RF input signals is detected.
17. The device of embodiment 15, wherein the incoming signal is an FM chirp signal, and each of the plurality of receivers is tuned to a different frequency of the FM signal.
18. An electronic device comprising the zero power radio frequency receiver of embodiment 1 or embodiment 2, or the device of embodiment 15.
19. The electronic device of embodiment 18 that is a wake-up receiver or a sensing node in a wireless network.

DETAILED DESCRIPTION OF THE INVENTION

The invention provides a zero power RF activated wake up device based on a high-Q MEMS demodulator that filters an AM RF tone of interest from the entire spectrum while producing a much higher voltage signal suitable to trigger a high-Q MEMS resonant switch tuned to the modulation frequency of the RF tone. Several features of the invention contribute to the RF actuation.

(1) An all-mechanical, high gain input stage amplifies weak RF signals without drawing power. A piezoelectric MEMS voltage transformer provides gain of at least 100. Because the transformer operates at an RF frequency while the resonant detector operates at 50 to 100 kHz modulation frequency, the combination can achieve high gain which is not possible with two mechanical stages both operating at the same resonance.

(2) The use of high Q resonant detector switches with low-adhesion contacts enables the detector to operate at low voltage.

(3) The use of a low power MEMS threshold switch avoids leakage currents to achieve a very small equivalent sub-threshold swing.

The zero power RF receiver is capable of detecting wake-up signatures transmitted from a source of interest, even in the presence of a noisy RF background. The weak incoming signal is amplified to close a contact which produces a wake-up bit. The amplitude modulated incoming RF signal is amplified by a unique high Q piezoelectric/mechanical voltage transformer. The amplified signal is frequency shifted in a voltage squared capacitor electrostatic forcer, allowing the amplified signal to drive a resonating contact switch. The switch allows the battery to generate a 1 V, 1 ms wake-up bit.

Figure 1A:
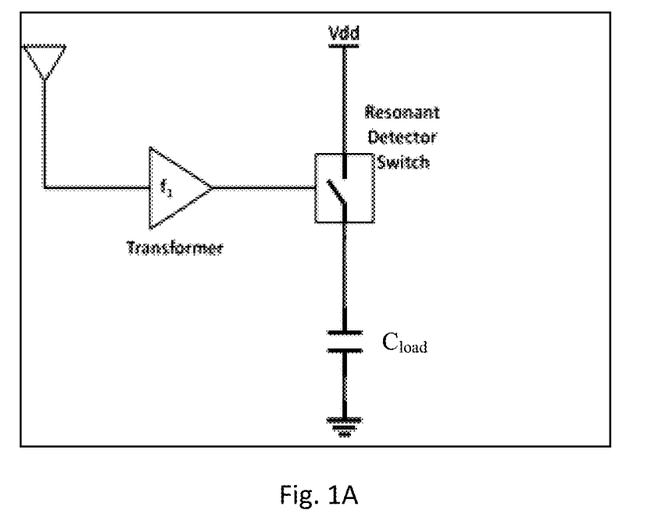
FIGS. 1A-1C show circuit diagrams for three embodiments of the invention.
Figure 1B:
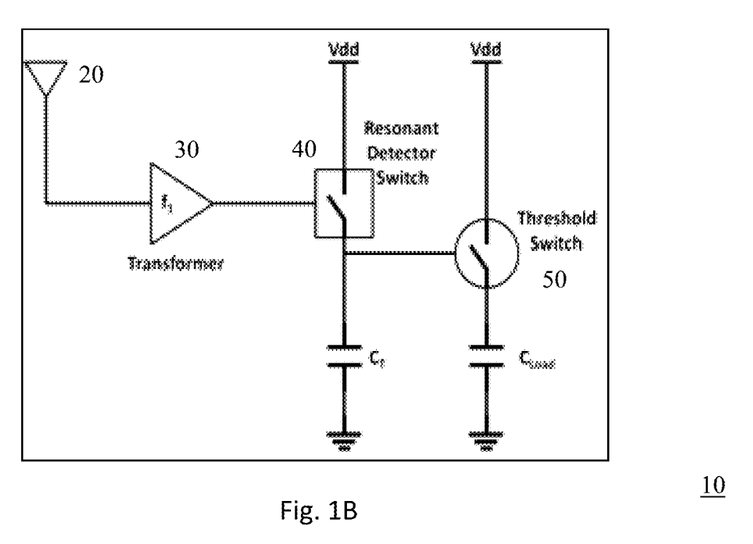

The zero power receiver shown schematically in FIGS. 1A-1B can be triggered by a −60 dBm (relative to 1 mW) amplitude modulated RF tone. The first stage of the demodulator is a zero power, high-Q, narrow-band piezoelectric MEMS voltage transformer that (i) filters the AM RF tone of interest from the entire spectrum and (ii) efficiently converts the low voltage (e.g., 300 μV on a 50Ω input impedance) of the input RF tone into a much higher voltage signal (e.g., 15 mV on the 2 kΩ/100 fF output impedance). The voltage-amplified signal is then fed to a high-Q capacitive MEMS resonant detector switch, tuned at the modulation frequency encoded in the signature, that extracts the low-frequency signal from the input signature (by the square-law relationship between mechanical force and input voltage) and, in the presence of the wake-up signature, periodically connects the system battery to the input capacitance of a threshold switch (comparator). Therefore, upon detection of the AM modulated RF tone, the input capacitance of the threshold switch is charged to the threshold voltage, in turn producing a 1 V output bit indicating detection. The transformer and mixer/resonant switch are not sensitive to supply voltage. The sensitivity of the demodulator is determined by 2 gain stages: (1) the low voltage RF signature is amplified by the transformer (e.g., 50×); and (2) the displacement generated by the non-linear electrostatic actuator is amplified by the MEMS resonator Q-factor (e.g., 1000 or more).

Figure 1C:
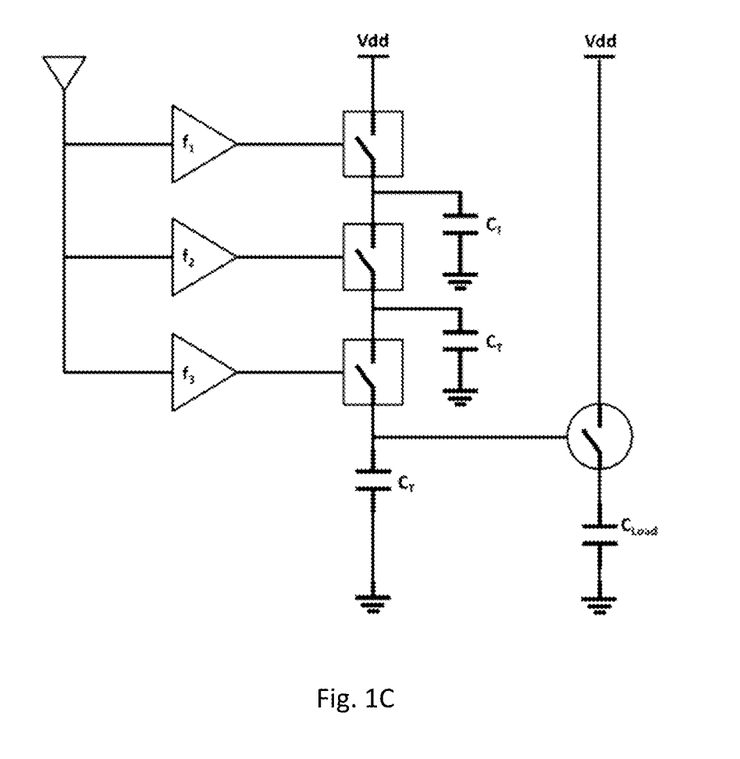

The zero power receiver embodiment shown in FIG. 10 can be triggered by a discretized linear FM chirp with a power level as low as −100 dBm. The discretized chirp signature can have a duration T of less than 30 ms and can contain on the order of 10 AM-modulated RF tones (different AM modulated RF tones are received at a rate of N/T). An array of N high-Q MEMS demodulators (each as shown in FIG. 1A or 1B), tuned to the RF frequencies contained in the discretized chirp, can be used for the detection of a wideband RF signature. The outputs of the N demodulators will be connected to implement an AND logic function (FIG. 10). Only when the entire sequence of tones (chirp) is received will the input capacitance of the threshold switch (comparator) be charged to the threshold voltage and produce the 1 V output bit indicating detection.

The sensitivity of the MEMS demodulator can be optimized to enable detection of an RF signature with power as low as −80 or even −100 dBm. The low voltage of each RF tone (30 μV on the 50Ω input impedance) is first transformed into a much higher voltage signal (roughly 3 mV). The stepped-up voltage signal then generates an approximately 100 nm p-p motion, sufficient to close the contact of the resonant switch. Because of the increased spectral content in this embodiment (10 AM RF tones) and specific time characteristic (tone rate) of the discretized RF chirp trigger, it is possible to maintain a false alarm rate less than 1/hour in a high interference background.

The receiver utilizes a high gain (100 or more), high Q (5000 or more), high coupling coefficient (8% or more) piezoelectric (e.g., AlN) MEMS resonant voltage transformer. One embodiment of the transformer is shown schematically in FIG. 2A. The open circuit voltage gain of state of the art devices has been less than 10 due to the limited figure of merit (product of the resonator Q factor and electromechanical coupling coefficient, $k_t^2 \cdot Q$ less than 40). However, AlN MEMS technology offers the advantage that high quality AlN thin films can be directly deposited on a substrate with a low temperature sputtering process. This enables stacking of multiple AlN and electrode layers, which can be properly configured to efficiently transduce the desired mode of vibration of the structure and simultaneously achieve the optimum input and output impedance values (crucial features for the implementation of an RF voltage transformer). The present transformer relies on an innovative concept in which top and bottom (i.e., above and below a piezoelectric plate, such as an AlN film) interdigital electrodes transduce a single mechanical mode based on the coherent combination of the $d_{31}$ and $d_{33}$ piezoelectric coefficients to realize electromechanical coupling ($k_t^2$) greater than 8%. The capability to excite a 2-dimensional mode of vibration in a 1.5 μm thick AlN plate using a single IDT has been demonstrated. See FIG. 2B for simulation of vibration modes. This first device proof of concept resulted in a 2.8 GHz resonator with a FoM approaching 50.

The intrinsic asymmetry in the mode shape of vibration of the structure can be exploited for the implementation of MEMS voltage transformers operating in the 0.5-1 GHz range with voltage gain values exceeding 100. In an embodiment, the piezoelectric transformer uses an AlN layer sandwiched between a bottom metal plate electrode and a top interdigitated transducer (IDT) metal electrode. When the electric field (Ez) is excited in the AlN, it produces a two-dimensional stress-vector (T) that has both a lateral component (Tx) and a vertical component (Tz). As the motion underneath the input port combines lateral and longitudinal displacements, the charge that is piezoelectrically generated is a function of both the AlN $d_{31}$ and $d_{33}$ piezoelectric coefficients. Although these two types of motion simultaneously exist underneath the input port, only the lateral displacement exists at the output port (FIG. 2B). Therefore, the input current can be expressed as the sum of two currents ($I_{lat}$ and $I_{thic}$), each of which refers to the piezoelectric charge collected by the motion in one direction, while the output current refers to the lateral motion only, $I_{out} \approx I_{lat}$, hence $I_{out} \propto I_{in}(1+d_{33}d_{31})^{-1}$. Furthermore, by terminating the output with a capacitance ($C_{out}$) smaller than the one at the input ($C_{in}$) (i.e., by creating asymmetry in the size of the input and output electrodes), one effectively stiffens the resonator at the output which acts to further reduce the motional current generated by the lateral piezostrain at the input port. Therefore, considering the relation between the input and output power of the transformer, the voltage gain can be expressed as:

$$G_v = \frac{V_{out}}{V_{in}} \propto \left(1 + \frac{d_{33}}{d_{31}}\right) \cdot \left(\frac{C_{in}}{C_{out}}\right) \cdot \left(\frac{1}{1 + \frac{1}{k_t^2 Q}}\right) \qquad (1)$$

As evident from Eq. (1), high voltage gain can be achieved by (i) maximizing the figure of merit of the resonant device ($k_t^2 Q$) and (ii) maximizing the input/output capacitance ratio. Furthermore, because of the unique vibration mode of the proposed device, Gv is further increased by a factor equal to $(1+(d_{33}/d_{31}))$, which for AlN is equivalent to 3.5.

Figure 2A:
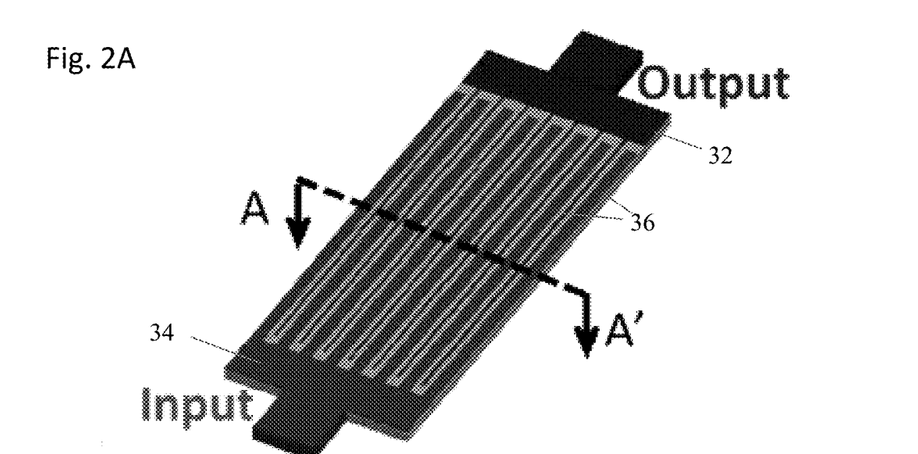
FIG. 2A is a schematic of a cross-sectional Lamé mode transformer.
Figure 2B:
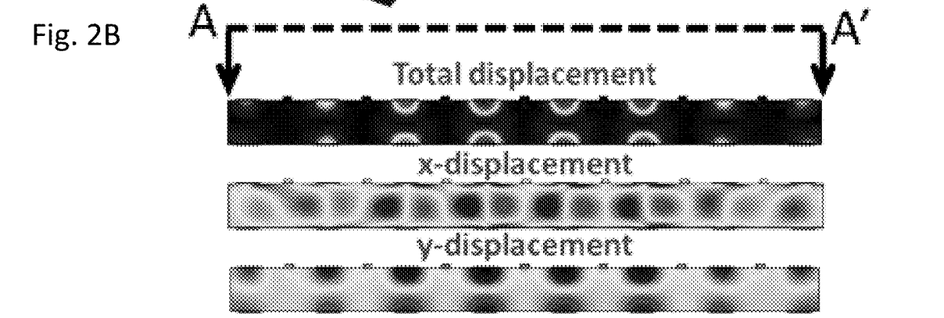
FIG. 2B shows a model of a two-dimensional vibration in the transformer of FIG. 2A upon the reception of an input signal.
Figure 2C:
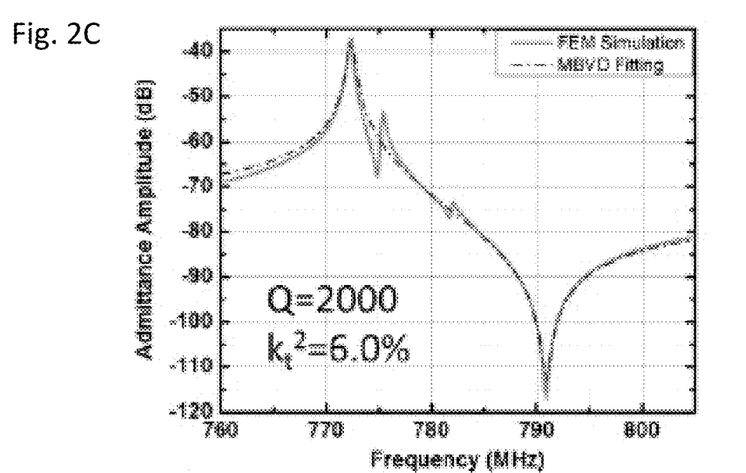
FIG. 2C shows a plot of simulated admittance amplitude vs. frequency for Q=2000 and $k_t^2$=6.0%.
Figure 2D:
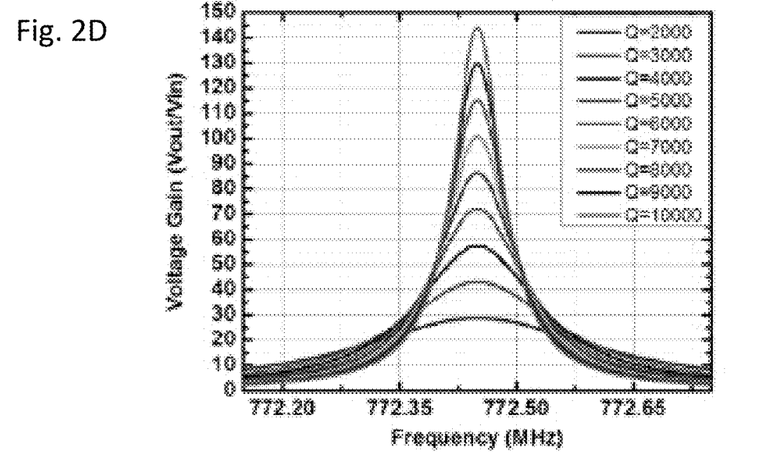
FIG. 2D shows a plot of simulated voltage gain vs. frequency for a series of different Q values ranging from 2000 (bottom curve) to 10000 (top curve).

An embodiment of a high gain AlN MEMS transformer is shown in FIG. 2A. The FEM simulation of this design showed that a $K_t^2 \approx 6\%$ can be achieved at 770 MHz in a 5.8 μm thick, 75 μm wide AlN plate. Spice and Comsol interfaced FEM simulations indicated that, for Q-factor values ranging between 2,000 and 10,000, an open-circuit voltage gain ranging from 30 to 145 can be achieved. This voltage gain is achieved for $C_{in}/C_{out}$ of 40. The transformer can be loaded by the input capacitance of the resonant detector switch ($C_{in\ switch}$ 90 fF); therefore the transformer can be properly sized to maintain $C_{in\ transformer}/C_{in\ switch}$ greater than 40. For example, in order to receive a 700 MHz tone, the transformer can be sized to have an input capacitance $C_{in\ transformer}$ of 4.5 pF (50 Ohm matched), which guarantees $C_{in\ transformer}/C_{in\ switch}$ equals 50.

A voltage gain greater than 100 can be achieved by (i) optimizing the resonator design for maximum FoM and (ii) connecting the inputs of a number (N>10) of identical transformers in parallel and the outputs in series to attain an N times larger voltage at the output. Furthermore, although the device resonance frequency is dependent on both the thickness of AlN ($T_{AlN}$) and the geometry of the input and output ports (due to the fact that the mode excited in the structure is a combination of both lateral and longitudinal vibrations), the operating frequency of the transformer can be lithographically adjusted. In fact, the device resonance frequency ($f_r$) de-pends on both the longitudinal ($v_l$) and the transverse ($v_t$) sound velocities. By lithographically varying the geometry of the electrodes it is possible to vary the effective value of $v_t$ ($v_{eff}$), which depends on the metal coverage. As verified, through COMSOL, a 10% variation of the device resonance frequency around 700 MHz can be attained, without degradation of $k_t^2$, by simply varying the width of the electrode forming the input port. This feature is crucial for the detection of the wide band RF signatures.

Figure 3:
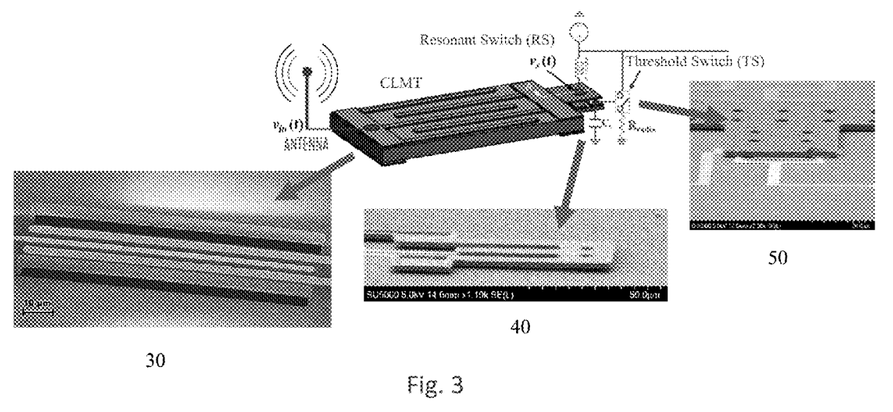
FIG. 3 shows an embodiment of the radio receiver of the invention. A schematic diagram is shown in the center of the figure. The inset at left shows a scanning electron micrograph (SEM) of a fabricated transformer device; the middle inset shows an SEM of a fabricated resonator switch; and the inset at right shows an SEM of a fabricated threshold switch. The three devices are fused into a single common structure.

FIG. 3 shows a receiver device based on microelectromechanical resonators. An AlN cross-sectional Lamé mode piezoelectric transformer is connected to an antenna and to a resonant switch. The antenna receives an AM-signal such that its spectral components can electrically drive the resonant switch and produce a low frequency resonant motion through the quadratic electrostatic force acting on the resonant switch (RS). As the input power received by the antenna exceeds a certain threshold ($P_{th}$), the tip of the resonant switch starts touching an immovable metal contact connected to a DC voltage supply, thus enabling the flow of charge towards a large capacitor ($C_{load}$). As the voltage across the capacitor exceeds a certain threshold, a threshold switch (TS) is activated, thus turning on the radio.

With the voltage-amplified RF signal as an input, the signal at the modulation frequency can be detected with an electrostatically-actuated resonant MEMS switch. Because the force is proportional to voltage squared, the force has a DC component, a component at twice the carrier frequency, and a component at the modulation frequency. Only the resonant response to the modulation frequency is significant. The signal to be detected is very small (less than 10 mV) relative to the voltages normally used to close MEMS switches. The resonant nature of the switch increases the displacement of the resonant element (e.g., a cantilever beam) by a factor of Q relative to that of a static switch, so it makes the switch selective to the modulation frequency, and it allows the design of the switch to have a contact separation force that prevents contact adhesion.

Figure 4A:
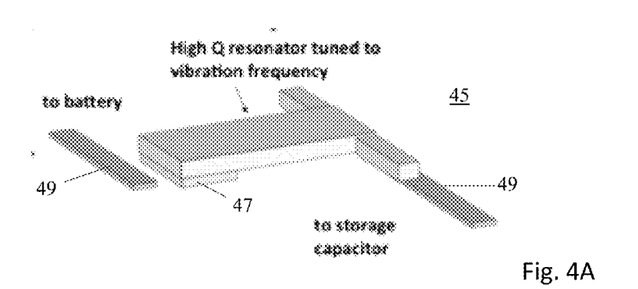
FIGS. 4A and 4B show two different configurations of a low adhesion contact of a resonator switch.
Figure 4B:
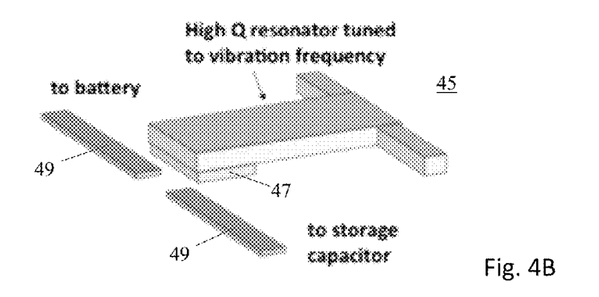

An embodiment of the resonant detector switch is shown schematically in FIGS. 4A and 4B. In this embodiment, the switch includes a cantilever portion which contains a resonator tuned to the modulation frequency of the selected input RF signal. When the modulation frequency is input to the resonant detector switch from the transformer, the cantilever portion vibrates and causes intermittent contact to be established though a low adhesion contact attached to the cantilever portion. The two configurations shown in FIGS. 4A and 4B have alternative arrangements of the conductive path, leading through the switch in the embodiment of FIG. 4A and only through a gold contact pad in the embodiment of FIG. 4B.

In an exemplary embodiment, the resonant detector switch has the following properties: an AlN cantilever-beam electrostatic resonant switch with a Q of 2500, dimensions of 20×50×0.5 μm³, and a gate gap of 100 nm, achieving 100 nm p-p vibration at 340 kHz. The gate capacitance is 90 fF. A restoring force of 90-200 nN results at the contact (depending on contact placement) when driven with a 100% modulated 700 MHz with a peak amplitude of 18 $mV_{rms}$. The contact separation force is within the range of forces that have previously been observed in successful switches.

Reliable, low-adhesion contacts are critical to the resonant detector switch and the threshold switch, so that the switches can make multiple contacts and be used repeatedly. The need for low-adhesion contacts increases as the power levels for RF and sensor detection drop. For low-adhesion contacts, soft materials (like gold) are poor choices, because they can easily deform and show high real contact area and high adhesion. Hard, refractory materials, like ruthenium, have lower mechanical adhesion and less sensitivity to electrical currents/voltages. Other considerations are that the material should have a reasonably low resistivity, should not easily form an insulating oxide, and should be made from a material that is resistant to the buildup of insulating organic layers [13].

The contact resistance with a relatively clean metallic or conducting metallic oxide contact is almost always less than a few kΩ, even for nm-scale contacts. The simple expression for contact resistance is ρ/2a, where a is the contact radius. In the extreme case, where a is 3 nm, and ρ is 20 μΩ-m (highly doped silicon), the resistance is only 3000Ω. The adhesion depends on the local geometry. Smaller radius asperity contacts result in lower adhesion, but generally the overall design size of the contact is not very important because it is the microstructure that determines the contact radius, and therefore the real contact area, and the real area of contact is much smaller than the designed contact area. Adhesion in contacts covers a wide range, from the adhesion seen in small-radius contacts similar to those in an atomic force microscope, where the adhesion can range from tens of nanoNewtons, down to less than one nN to those in low-resistance MEMS switches with contact forces of hundreds of μN that can exhibit adhesion of tens or hundreds of μN. Operation usually increases adhesion because contact area often permanently increases with contact force (both applied force and adhesion force) due to plastic deformation. Preferably, contacts are fabricated with small-radius asperities from hard materials such as tungsten or ruthenium/ruthenium oxide.

Contact separation forces are lower for all switch elements with the exception of the threshold switch. Achieving lower power RF actuation of the resonant detector depends on fabricating ultra-low-adhesion contacts. Hard nanowires or nanotubes can minimize contact area and capacitance while at the same time minimizing plastic deformation, because the elasticity of the nanowire/nanotube structure allows staying within the elastic limit over a wide range of contact displacement/force.

Figures 5A, 5B, 5C, 5D, 5E, 5F, 5G, 5H:
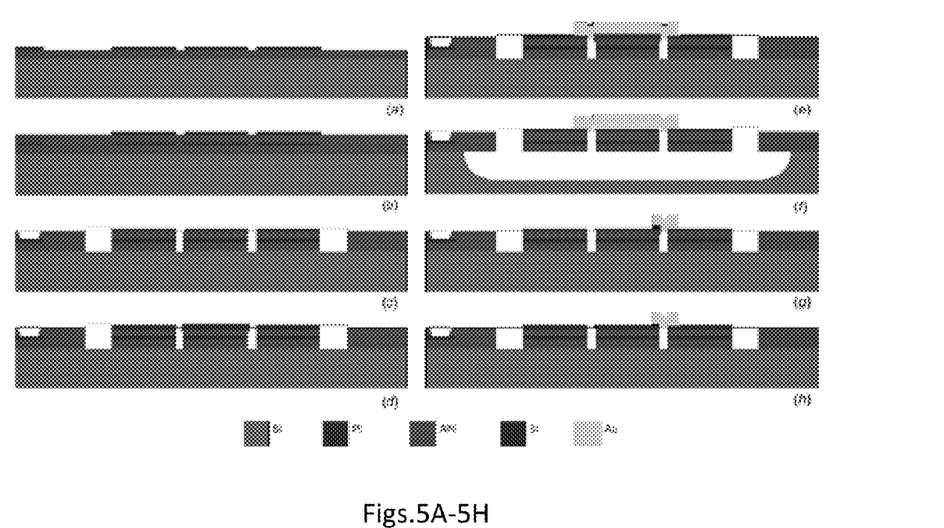
FIGS. 5A-5H show steps of a process for fabricating a resonator switch.

The switch fabrication is very similar to the resonator fabrication process, but optimized for switches by the placement of one set of electrodes in the center of the AlN stack, rather than on opposite sides, and by the addition of contacts and, for the resonant detector switch, a gate for electrostatic actuation. This has the advantage of a common vehicle for process development in the switch/voltage amplifier effort, the use of a material that can achieve high-Q values for the resonant detector switch, and the availability of both piezoelectric and electrostatic actuation to enhance switch performance. As shown in FIGS. 5A-5H, the switch fabrication process is quite similar to processes used for AlN resonators [14, 15]. The resonant cantilever is in the center, although the outer cantilevers could be made to resonate as well. For the electrostatic actuator, a silicon sacrificial layer is deposited on the center cantilever, followed by a gold electroplated gate electrode. A similar electroplating process, in combination with separate contact material deposition, is used to fabricate contacts out of various materials as shown in FIGS. 5G and 5H. An alternative path to a resonant switch is to use a low-stress gold-plated switch process [16].

Figure 6A:
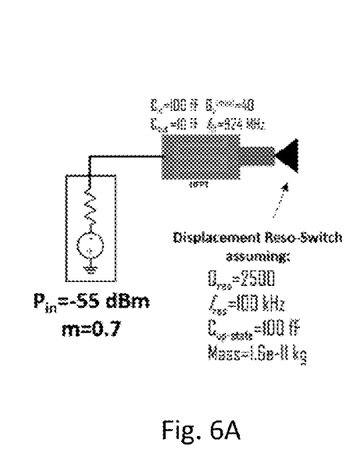
FIG. 6A shows a circuit schematic used to simulate the performance of a radio receiver of the invention, showing input and output capacitances, maximum voltage gain, resonant frequency, quality factor, rest capacitance, and mass value.
Figure 6B:
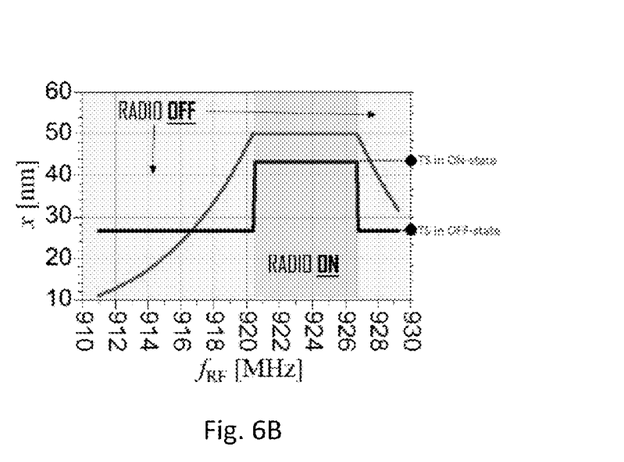
FIG. 6B shows the simulated amplitude of the resonant displacement phasor relative to the resonant switch (x) as a function of frequency, assuming a total RF input power of −55 dBm.

FIGS. 5A-5H show an embodiment of a process for fabricating the resonant detector switch. FIG. 5A shows deposition of AlN on a Si substrate; including deposition and patterning of level 1 Pt electrodes. FIG. 5B shows deposition of AlN layer on level 1 Pt electrodes, and deposition and patterning of level 2 Pt electrodes. FIG. 5C shows a dry etch process to define resonant structures and create vias for contact to the lower electrodes. FIG. 5D shows deposition of a Si sacrificial layer. FIG. 5E shows plating of a gold gate electrode. FIG. 5F shows $XeF_2$ release of mechanical structures. FIG. 5G shows a contact view of the actuator process with deposited contact material. FIG. 5H shows $XeF_2$ release of the contact The simulated performance of a receiver based on a 100 kHz resonant switch, a 940 MHz transformer, and a received power of −55 dBm is shown in FIGS. 6A and 6B. The equivalent circuit model representing the electrical behavior of the transformer adopted in the simulation was extracted through the direct measurement of the electrical performance of a built transformer (FIG. 6A). In contrast, to more precisely model the behavior of the resonant switch in a commercial circuit simulator, a new symbolically defined component was defined (SDD) depicting the nonlinear dynamics in both its electrical and mechanical responses. The scheme used to analyze the performance of the MRFS is shown in FIG. 6B. As evident from FIG. 6B, the simulated receiver device permitted activation of the threshold switch, and consequently, of the radio, through a low input power value of −55 dBm.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present invention has been described in conjunction with certain preferred embodiments, one of ordinary skill, after reading the foregoing specification, will be able to effect various changes, substitutions of equivalents, and other alterations to the compositions and methods set forth herein.

REFERENCES

1. J. Bernstein, "3D Low Frequency Wakeup Receiver," www.ams.com/LF-Receiver/AS3933, accessed February, 2015.
2. Hidetoshi Takahashi, et al, "A wake-up switch using a piezoelectric differential pressure sensor," IEEE Intelligent Sensors, Sensor Networks and Information Processing Conference, Melbourne VIC, Apr. 2-5, 2013, pp. 23-26.
3. Lin Gu, John A. Stankovic "Radio-Triggered Wake-Up Capability for Sensor Networks," Proceedings of the 10th IEEE Real-Time and Embedded Technology and Applications Symposium (RTAS'04), 2004.
4. Robert W. Brocato, Sandia Report SAND 2004-4610, September 2004.
5. Aaron N. Parks, et al., "A Wireless Sensing Platform Utilizing Ambient RF Energy," Biomedical Wireless Technologies, Networks, and Sensing Systems, Austin, Tex., Jan. 20-23, 2013, pp. 154-156.
6. Aaron N. Parks, Joshua R. Smith, "Sifting Through the Airwaves: Efficient and Scalable Multiband RF Harvesting," 2014 IEEE International Conference on RFID (IEEE RFID), Orlando, Fla., Apr. 8-10, 2014, pp. 74-81.
7. Roy Olsson, "Zero Power Acoustic Signal Processing", Science Matters Sandia National Laboratories, www.sandia.gov/mstc/_assets/documents/science/Science%20-Matters%20Spring%202010%20Zero%20Power%20-Accoustic%20Signal%20Processingl.pdf, accessed Feb. 18, 2015.
8. Yutaka Tomimatsu, et al, "A piezoelectric flow sensor for use as a wake-up switch for a wireless sensor network node," IEEE 2012 Second Workshop on Design, Control and Software Implementation for Distributed MEMS, Bensacon, Apr. 2-3, 2012, pp. 53-37.
9. E. Sifuentes, et al., "Wireless Magnetic Sensor Node for Vehicle Detection" IEEE Sensors Journal, Vol. 11, No. 8, August 2011, pp. 1669-76, 10. Yang Lin, et al., "The Micromechanical Resonant Switch (Resoswitch)," Technical Digest Solid State Sensor, Actuator, and Microsystems Workshop, Hilton Head, S.C., June 1-5, pp. 40-43.
11. Yang Lin, Wei-Chang Li, Zeying Ren, Clark T.-C. Nguyen, "A Resonance Dynamical Approach to Faster, More Reliable Micromechanical Switches," IEEE Frequency Control Symposium, May 19-21 2008. pp. 640-5.
12. Ark-Chew Wong, Clark T.-C. Nguyen, "Micromechanical Mixer-Filters (Mixlers)," JMEMS, Vol. 13, No. 1, February 2004, pp. 100-111.
13. L. Chen, et al., "Contact resistance study of noble metals and alloy films using a scanning probe microscope test station," J. Appl. Phys. 102, 074910, 1 Oct. 2007.
14. M. Rinaldi, et al., "Reconfigurable CMOS Oscillator based on Multi-Frequency AlN Contour-Mode MEMS Resonators", IEEE Transactions on Electron Devices, vol. 58, issue 5, pg. 1281-1286, 2011.
15. M. Rinaldi, et al., "Super High Frequency Two-Port AlN Contour-Mode Resonators for RF Applications", IEEE Transactions on Ultrasonics, Ferroe-lectrics, and Frequency Control, vol. 57, n. 1, pg. 38-45, 2010.
16. S. Majumder, et al., "Study of Contacts in an Electrostatically Actuated Microswitch," Sensors and Actuators A, Vol. 93, pp. 19-26, 2001.

What is claimed is:

1. A zero power radio frequency receiver comprising:
a radio frequency antenna;
a microelectromechanical voltage transformer having an input and an output, wherein the input is connected to the antenna, wherein the transformer amplifies an amplitude modulated radio frequency (RF) input signal received by the antenna, and wherein the transformer provides a modulation frequency of the input signal at the transformer output;
a resonant detector switch connected to the output of the transformer and tuned to the modulation frequency, the switch comprising a low adhesion contact that closes in response to the modulation frequency; and
a power source that drives a wakeup circuit, wherein the wakeup circuit is closed by closing of the low adhesion contact.

2. The receiver of claim 1, further comprising a threshold switch comprising a threshold contact residing in the wakeup circuit, the threshold switch connected to the resonant detector switch, wherein the threshold contact closes the wakeup circuit in response to closing of said low adhesion contact.

3. The receiver of claim 1 or claim 2, wherein the closed wakeup circuit produces a wakeup signal for an electronic device.

4. The receiver of claim 3, further comprising an input capacitance that loads the output of the transformer and an output capacitance that loads the wakeup circuit, wherein the input capacitance stores charge used to activate the threshold switch, and wherein the output capacitance stores charge used to produce the wakeup signal.

5. The receiver of claim 1, wherein the power source is a battery.

6. The receiver of claim 1, wherein the transformer is a piezoelectric mechanical voltage transformer.

7. The receiver of claim 6, wherein the transformer comprises a film of AlN in contact with two interdigitated electrodes.

8. The receiver of claim 1, wherein the transformer has a gain of at least 30.

9. The receiver of claim 1, wherein the transformer is able to detect and amplify incoming radio frequency signals having a power of −60 dBm or lower.

10. The receiver of claim 1, wherein the transformer is tuned to an input signal in the MHz range and the resonant detector switch is tuned to a modulation signal in the 50-100 kHz range.

11. The receiver of claim 1, wherein the resonant detector switch comprises:
a substrate;
a cantilever supported by the substrate, the cantilever having a resonant electrode structure and comprising a first aluminum nitride layer, a first electrode layer disposed on the first aluminum nitride layer, a second aluminum nitride layer disposed on the first electrode layer, and a second electrode layer disposed on the second aluminum nitride layer; and
a low adhesion contact disposed at a free end of the cantilever;
wherein vibration of the resonant electrode structure closes the low adhesion contact in response to a selected input signal frequency.

12. The receiver of claim 11, wherein low adhesion contact comprises a material selected from the group consisting of platinum, tungsten, ruthenium, and ruthenium oxide.

13. The receiver of claim 1 that has a Q-factor of at least 1000.

14. The receiver of claim 1 that uses about 10 nW or less of power in the absence of the input signal.

15. A device comprising a plurality of zero power radio frequency receivers of claim 1 or claim 2, wherein the receivers are tuned to two or more different input signals, each different input signal having a different RF frequency, wherein the resonant detector switches of the receivers are connected in series and activate a single threshold switch.

16. The device of claim 15, wherein the threshold switch is activated and a wakeup signal generated only when each of the plurality of different RF input signals is detected.

17. The device of claim 15, wherein the incoming signal is an FM chirp signal, and each of the plurality of receivers is tuned to a different frequency of the FM signal.

18. An electronic device comprising the zero power radio frequency receiver of claim 1 or claim 2.

19. The electronic device of claim 18 that is a wake-up receiver or a sensing node in a wireless network.

20. An electronic device comprising the device of claim 15.

21. The electronic device of claim 20 that is a wake-up receiver or a sensing node in a wireless network.

* * * * *